United States Patent [19]

Carter

[11] 4,179,625
[45] Dec. 18, 1979

[54] NOISE PULSE PRESENCE DETECTION CIRCUIT

[75] Inventor: Aaron B. Carter, Chicago, Ill.

[73] Assignee: Bell Telephone Laboratories, Incorporated, Murray Hill, N.J.

[21] Appl. No.: 855,456

[22] Filed: Nov. 28, 1977

[51] Int. Cl.² .......................... H03K 5/153; H03K 5/18
[52] U.S. Cl. .................................... 307/234; 307/232; 328/109; 328/112; 328/162
[58] Field of Search ............... 328/109, 111, 112, 162; 307/232, 234

[56] References Cited

U.S. PATENT DOCUMENTS

| | | | |
|---|---|---|---|
| 3,204,189 | 8/1965 | Trautwein | 307/234 X |
| 3,634,869 | 1/1972 | Hsueh | 307/234 |
| 3,689,846 | 9/1972 | Naeyaert | 307/234 X |

OTHER PUBLICATIONS

L. G. Walewski, "Digital–Pulse Filter and Delay" IBM Technical Disclosure Bulletin, vol. 18, No. 9, Feb., 1976 p. 2755.

Primary Examiner—John Zazworsky
Attorney, Agent, or Firm—Peter Visserman

[57] ABSTRACT

A novel pulse detection circuit for recognizing undesirable noise pulses within digital logic circuitry is disclosed. The detection circuit allows for pulse amplitude and pulse width discrimination and will generate output signals indicative of the presence of pulses of amplitude greater than a selected amplitude and width less than a selected duration. Logic voltage comparators and a variable reference voltage source are used to allow for variable pulse amplitude discrimination of both positive transition and negative transition incoming signals. An incoming signal of greater amplitude than a reference signal will be reflected in both a direct output pulse signal and an inverted output pulse signal of the voltage comparators. The direct output pulse signal is applied to a first flip-flop after being delayed by a first given interval of time. The inverted output pulse signal is delayed by a second interval of time and is then utilized to set a second flip-flop whose output is an input signal to the first flip-flop. The first flip-flop will be set only if the delayed trailing edge of the inverted output pulse signal sets the second flip-flop prior to the arrival of the delayed leading edge of the output pulse signal at the first flip-flop. Additionally, the leading edge of the direct output pulse signal of the voltage comparators is utilized to set a third flip-flop which in turn resets the second flip-flop to enable the circuit for detection of subsequently occurring pulses.

10 Claims, 3 Drawing Figures

PULSE WIDTH > 30nsec

PULSE WIDTH < 30nsec

NOISE PULSE PRESENCE DETECTION CIRCUIT

FIELD OF THE INVENTION

This invention relates to pulse detection circuits for recognizing undesirable noise pulses and more particularly to pulse detection circuits utilizing variable pulse amplitude discrimination and pulse width discrimination.

BACKGROUND OF THE INVENTION

In present-day digital logic circuits which utilize logic gates which respond in a low nanosecond range, even noise pulses of very short duration may create logic errors. Further, it is not always possible to design complex logic circuits based on a full worst-case design to totally avoid noise problems. Thus, it is desirable that a simple means is available to detect and locate the statistically few, but bothersome, noise problems which may result.

Several circuit arrangements exist within the prior art which utilize the concepts of pulse width and pulse amplitude discrimination. However, each of these schemes suffers from limitations. Several prior art circuits discriminate against noise pulses by detection of only pulses greater than a specified width, but are limited in that they cannot provide a signal indicating that a pulse has occurred which is less than a predetermined width. In a further prior art scheme a counter is started by an incoming signal and is incremented periodically for the duration of the signal. A test period or pulse width is determined by the final value of the counter. Another prior art scheme involves the use of external clock phase input pulses to allow for the detection of input signals of duration greater than a specific pulse width. Such circuits are also complex in structure and have the further limitation of requiring external clock input signals to discriminate pulse width. None of these prior art arrangements are capable of detecting the presence of narrow noise pulses.

SUMMARY OF THE INVENTION

The present invention provides a noise pulse detection circuit capable of both variable pulse amplitude discrimination and pulse width discrimination. Voltage comparison means generate a direct output signal pulse and an inverted output signal pulse when a positive transition incoming signal pulse has an amplitude greater than a given variable reference amplitude. A noise recognition signal indicative of the presence of a signal having a duration less than a predetermined duration will be generated when the trailing edge of the inverted output signal pulse occurs in time prior to the leading edge of the direct output signal delayed by a time $\Delta T1$. Additionally, delaying the inverted output signal pulse by a time $\Delta T2$ and enabling a bistable element of the detection circuit via the leading edge of the direct output signal pulse allows for detection of extremely narrow noise pulses of durations less than the propagation delay times of the bistable elements in the circuit. In accordance with the present invention, a negative transition incoming signal pulse with an amplitude greater than a given variable reference amplitude may also be detected.

BRIEF DESCRIPTION OF THE DRAWING

The invention may be understood from the following detailed description when read with reference to the drawing in which.

DETAILED DESCRIPTION

Figure 1:
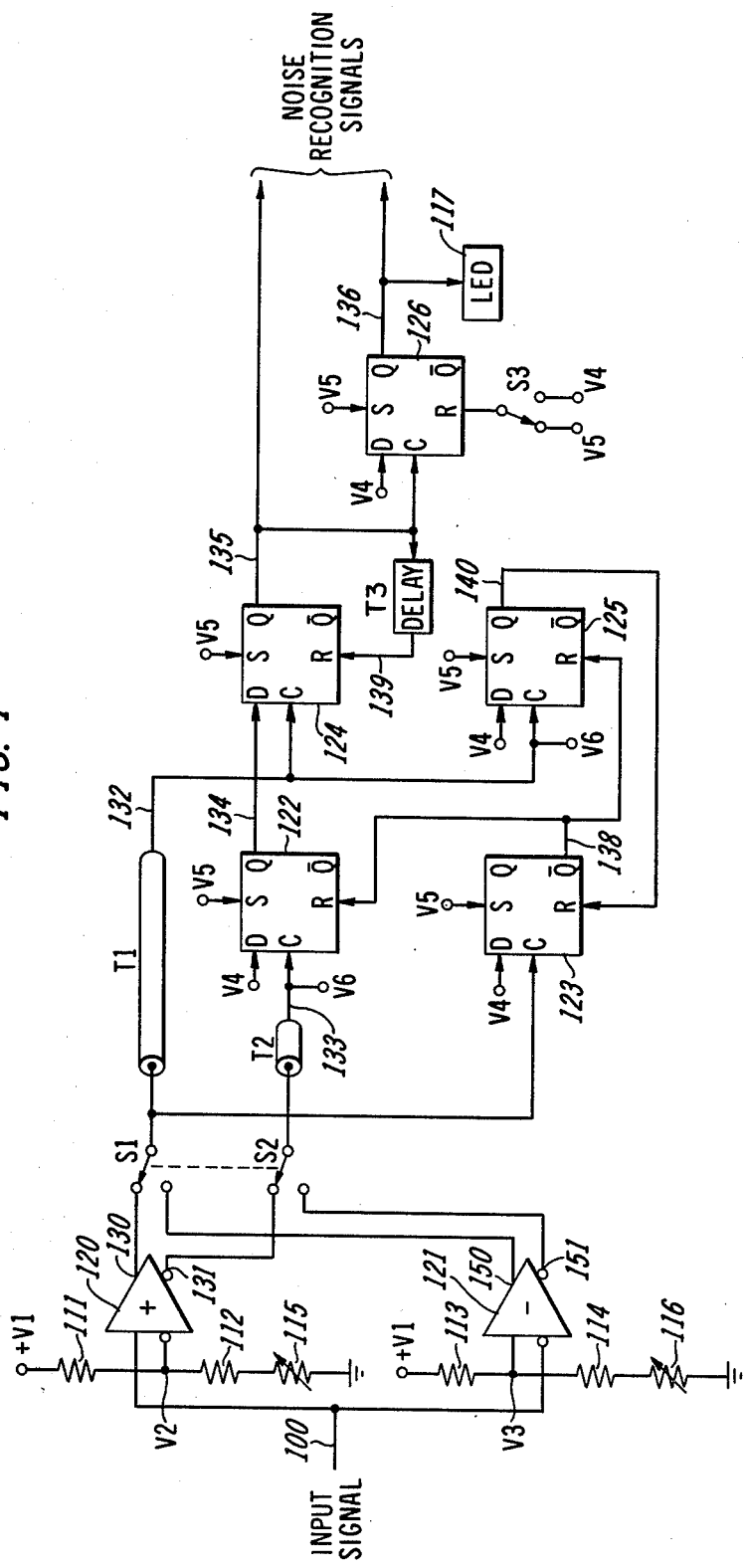
FIG. 1 is a schematic diagram of a noise pulse detection circuit in accordance with the invention.

A noise pulse detection circuit according to the invention is shown in FIG. 1. An input signal, which may have a pulse width of a few nanoseconds, is applied to dual voltage comparators 120 and 121 via conductor 100 for the purpose of amplitude comparison with reference voltages V2 and V3. The input signal is applied to a first input terminal of the voltage comparator 120 and the reference voltage signal V2 is applied, as shown in FIG. 1, at an inverting second input terminal of the voltage comparator 120. The reference voltage signal V2 is obtained at the inverting second input terminal by means of connection to a positive DC voltage source V1 through resistor 111 and a connection to ground through a resistor 112 in series with a variable resistance 115. The variable resistance 115 allows for variation of the reference voltage V2 which is the pulse amplitude threshold voltage for a positive transition input signal. The threshold voltage V2 may be varied in magnitude over a range determined by the magnitude of the DC voltage source V1, the values of the resistors 111 and 112, and the range of variation of the variable resistor 115. Voltage comparator 120 will generate a direct output signal at terminal 130 and an inverted output signal at terminal 131 when the amplitude of the input signal appearing on conductor 100 goes from a lesser value to a value greater than reference voltage V2.

Similarly, the input signal appearing on conductor 100 is further applied to an inverting first input terminal of voltage comparator 121. The reference voltage V3, which is the pulse amplitude threshold voltage for a negative transition input signal, is obtained in a similar manner as reference voltage V2. The threshold voltage V3 may be varied in magnitude over a range determined by the magnitude of the DC voltage source V1, the values of resistors 113 and 114, and the range of variation of the variable resistor 116. Voltage comparator 121 will generate a direct output signal at terminal 150 and an inverted output signal at terminal 151 when the amplitude of the input signal appearing on conductor 100 goes from a greater value to a value less than voltage reference V3.

Since it is desirable to detect very narrow noise pulses of widths less than several nanoseconds and to further provide rapid recognition signals upon receipt of an incoming noise pulse, the dual voltage comparators 120 and 121 shown in the illustrative embodiment of FIG. 1 should exhibit rapid signal response and propagation times. Such voltage comparators are well-known in the art and are commercially available.

It should be noted that when testing signal/noise relationships in digital logic circuitry, the noise conditions of interest are those occurring on conductors between the output of a driver gate circuit and the input of a load gate circuit which would tend to falsely trigger the load gate circuit. When the output of a driver gate circuit is in a low state, i.e. the load gate circuit is being held in its state by a low input voltage, a positive going noise pulse of sufficient amplitude may falsely trigger the load gate circuit. Such a positive going pulse is said to have an amplitude greater than the low state gate noise margin voltage of the specific circuit being tested. Similarly, when the output of a driver gate circuit is in a high state, i.e. the load gate circuit is being held in its state by a high input voltage, a negative going noise pulse of sufficient amplitude may falsely trigger the load gate circuit. Such a negative going pulse is said to have an amplitude greater than the high state gate noise margin voltage of the specific circuit being tested. To test for conditions likely to cause false switching, the variable reference voltages V2 and V3 are utilized to simulate the low state gate noise margin voltage and the high state gate noise margin voltage, respectively of the circuit being tested. Accordingly, switches S1 and S2 are provided to allow for detection of either positive transition noise pulses or negative transition noise pulses. As shown in the drawing, switches S1 and S2 are connected to the output terminals 130 and 131, respectively, of the voltage comparator 120; thus, the switches are in a position to allow for detection of positive transition noise pulses relative to the reference voltage V2. If the switches S1 and S2 were switched such that S1 was connected to the direct output terminal 150 of voltage comparator 121 and switch S2 was connected to the inverted output terminal 151 of voltage comparator 121, then the circuit would allow for detection of negative transition noise pulses relative to the reference voltage V3.

This illustrative embodiment of the noise detection circuit of the present invention comprises a plurality of identical flip-flops 122 through 126. The pulse detection arrangement is capable of detecting extremely narrow noise pulses having widths of less than several nanoseconds utilizing commercially available "D" type flip-flops having rapid response and propagation times of proportionate magnitude. Each flip-flop 122 through 126 has a "D" input terminal (D), a clock signal input terminal (C), two output terminals (Q and $\bar{Q}$), each of which is the complement of the other, an asynchronous "SET" input terminal (S), and an asynchronous "RESET" input terminal (R). For purposes of description of the operation of these flip-flops 122 through 126 and for subsequent description of the operation of the illustrative embodiment of the present invention shown in FIG. 1, a voltage representative of a binary "1" will be termed a "high" signal and a voltage representative of a binary "0" will be termed a "low" signal. A high signal at the S input terminal would unconditionally cause the corresponding Q output signal to be in a high state and accordingly, the $\bar{Q}$ output signal to be in a low state. Each flip-flop 122 through 126 has a permanent low signal V5 connected to its associated S input terminal. Similarly, a high signal at the R input terminal will unconditionally cause the corresponding Q output signal to be in a low state and accordingly, the $\bar{Q}$ output signal to be in a high state. A low signal at both the S and R input terminals will allow the flip-flop to be "enabled" and thus, output signals at Q and $\bar{Q}$ will be dependent upon input signals at the D and C input terminals. With the S and R input terminals in a low state, the leading edge of a low to high state transition pulse at the C input will cause the signal appearing at that time at the D input to be gated to the Q output terminal. By example, if the D input is in the "1" state, a "0" to "1" transition pulse occurring at the C input will cause a "1" to appear at the Q output and a "0" to appear at the $\bar{Q}$ output. Similarly, if the D input is in the "0" state, a "0" to "1" transition pulse occurring at the C input will cause a "0" to appear at the Q output and a "1" to occur at the $\bar{Q}$ output. Negative going transition pulses, i.e. high to low transitions, at the C input will have no effect on the output signals appearing at the Q and $\bar{Q}$ output terminals. When a flip-flop has a high signal appearing at its respective Q output terminal, it is said to be in a "SET" state. When a low signal appears at its respective Q output terminal, it is said to be in a "RESET" state. If a high signal is present at either the S or R input terminal, then pulses appearing at the D or C input terminals will have no effect on the signals appearing at the Q and $\bar{Q}$ output terminals.

For the purpose of the following discussion the switches S1 and S2 will be assumed to be connected to the output terminals 130 and 131 respectively of the first voltage comparator 120 as shown in the drawing. A positive going transition input signal pulse appearing on conductor 100 which is greater in amplitude than reference voltage V2 will be reflected as a signal occurring at the direct output terminal 130 and at the inverted output terminal 131 of the voltage comparator 120. The signal occurring at the direct output terminal 130 is applied to the delay line T1 which generates a delayed signal on conductor 132. Similarly, the signal occurring at the inverted output terminal 131 is applied to delay line T2 which generates an inverted delayed signal on conductor 133. These delay lines T1 and T2 are readily available commercially and are well-known in the art. For purposes of description, the delay intervals associated with delay lines T1 and T2 shown in FIG. 1 will be referred to, hereafter, as $\Delta T1$ and $\Delta T2$ respectively.

The leading edge (i.e., the positive transition) of the signal appearing on conductor 132 is utilized as the clock signal input (C input) to flip-flop 124. The signal occurring at the inverting output terminal 131 of voltage comparator 120, after being delayed by the delay line T2, is utilized as a clock signal input (C input) to flip-flop 122. A standard termination network should be connected to the C input terminal at V6 to provide for impedance matching of delay line T2 and to provide an external pull-down resistance for the input voltage comparator. Such circuits are easily duplicated and are well known in the art. A permanent high signal V4 is connected to the D input terminal. Thus, with a low signal at the R input terminal of flip-flop 122, a low to high signal transition at the clock signal input will cause the permanent high signal V4 at the D input to be gated to the Q output terminal and low signal to occur at the $\bar{Q}$ output terminal. Whereas the signal at output terminal 131 is an inverted output signal, the trailing edge of the output signal pulse appearing on conductor 133 will be a positive going transition capable of triggering flip-flop 122. The Q output signal of flip-flop 122 is utilized as a D input signal to flip-flop 124. Since flip-flops 122 and 124 have a permanent low signal V5 connected to their respective S input terminals, these flip-flops will be enabled when each flip-flop has a low signal at its respective R input terminal. Thus, if the trailing edge of the output pulse signal of delay line T2 sets flip-flop 122 prior to the arrival of the leading edge of the output pulse signal of delay line T1 at the clock input of flip-flop 124, the flip-flop 124 will be set upon the arrival of the output pulse signal on conductor 132, and will be indicative of the incoming signal on conductor 100 having a pulse width of less duration than a threshold pulse width $\Delta T$. The threshold width $\Delta T$ may be defined as approximately equal to $(\Delta T1 - \Delta T2 - \Delta P)$, where $\Delta T1$ is defined as the delay interval of delay circuit T1, $\Delta T2$ is defined as the delay interval of delay circuit T2, and $\Delta P$ is defined as the propagation delay of any of the flip-flop circuits 122 through 126. By choosing delay lines T1 and T2 of specific durations, the present invention may be utilized to designate pulses of less than the threshold pulse width $\Delta T$ to be noise pulses and to generate output signals registering the occurrence of such pulses.

The direct output signal at terminal 130 from voltage comparator 120 is further connected through switch S1 to the clock input (C input) terminal of flip-flop 123. Flip-flop 123 is utilized to provide reset functions for flip-flops 122 and 125. A permanent high signal V4 is applied to the D input terminal. The $\overline{Q}$ output signal on conductor 138 is connected to the R input terminals of flip-flops 122 and 125. Thus, with a low signal at the R input terminal of flip-flop 123, the leading edge of a pulse of the direct output signal at terminal 130 will cause the $\overline{Q}$ output signal on conductor 138 to go to a low state, thus enabling flip-flop 122 and flip-flop 125.

The direct output signal at terminal 130 of voltage comparator 120, after being delayed by the T1 delay line, is connected to the clock signal input (C input) of flip-flop 125. A standard termination network should be connected to the C input terminal at V6 to provide for impedance matching of delay line T1 and to provide an external pull-down resistance for the voltage comparator. Flip-flop 125 is utilized to provide a RESET function for flip-flop 123. A permanent high signal V4 is applied to the D input terminal of flip-flop 125 and its Q output signal on conductor 140 is applied to the R input terminal of flip-flop 123. As previously described, the $\overline{Q}$ output signal on conductor 138 of flip-flop 123 is applied to the R input terminal of flip-flop 125. When the leading edge of a pulse of the delayed signal on conductor 132 occurs at the clock signal input of flip-flop 125, the Q output signal on conductor 140 will go to a high state, thus resetting flip-flop 123. The resetting of flip-flop 123 will cause its $\overline{Q}$ output signal to go high, thereby resetting flip-flops 125 and 122.

From the symmetry of the illustrative embodiment shown in FIG. 1, it will be apparent to those skilled in the art that the operation of the novel circuit will essentially be the same for negative-going transition noise pulses. With the switches S1 and S2 connected to the output terminals 150 and 151 of voltage comparator 121, respectively, the operation of the circuit is unchanged since a direct signal will be again applied to delay line T1 and the inverse thereof will be applied to delay line T2.

When flip-flop 124 has been set, indicating that a pulse has been detected, the signal on conductor 135 appearing at the Q output terminal of flip-flop 124 will be in a high state, and will be utilized directly as a noise recognition signal. However, when testing logic circuits for noise pulse characteristics, it is often useful to have both a continuous output signal indicative that at least one noise pulse has occurred, and also to have a pulsing output signal wherein each pulse of the output signal is indicative of the occurrence of a noise pulse.

For these purposes the output signal on conductor 135 is applied through a delay circuit T3 (having a delay interval $\Delta T3$) to the RESET terminal (R input terminal) of flip-flop 124. Thus, when a pulse occurs at the Q output terminal of the flip-flop 124, the output signal on conductor 135 will be delayed by $\Delta T3$ and then utilized to reset flip-flop 124, thereby generating a low output signal on conductor 135 at the Q output terminal of flip-flop 124. The result will be an output signal on conductor 135 with a pulse width duration approximately equal to $\Delta T3$ for each occurrence of a noise pulse.

The output signal on conductor 135 is further utilized as a clock signal to flip-flop 126 to cause this flip-flop to be set upon the occurrence of the first noise pulse. A permanent high signal V4 is applied to the D input terminal, and an initialization switch S3 is connected to the R input terminal. The initialization switch S3 is normally closed to a permanent low signal V5, thereby enabling flip-flop 126. When the leading edge of a pulse occurs on conductor 135, the Q output signal on conductor 136 will go to a high state and will remain high until initialization switch S3 is momentarily switched to signal V4. This momentary switching resets flip-flop 126 and the Q output signal on conductor 136 goes to a low state. The Q output signal thus provides a continuous output noise recognition signal which is reset only upon initialization via switch S3, and may be used to drive a visual signal such as the LED (Light Emitting Diode) circuit 117 shown in FIG. 1.

Figure 3:
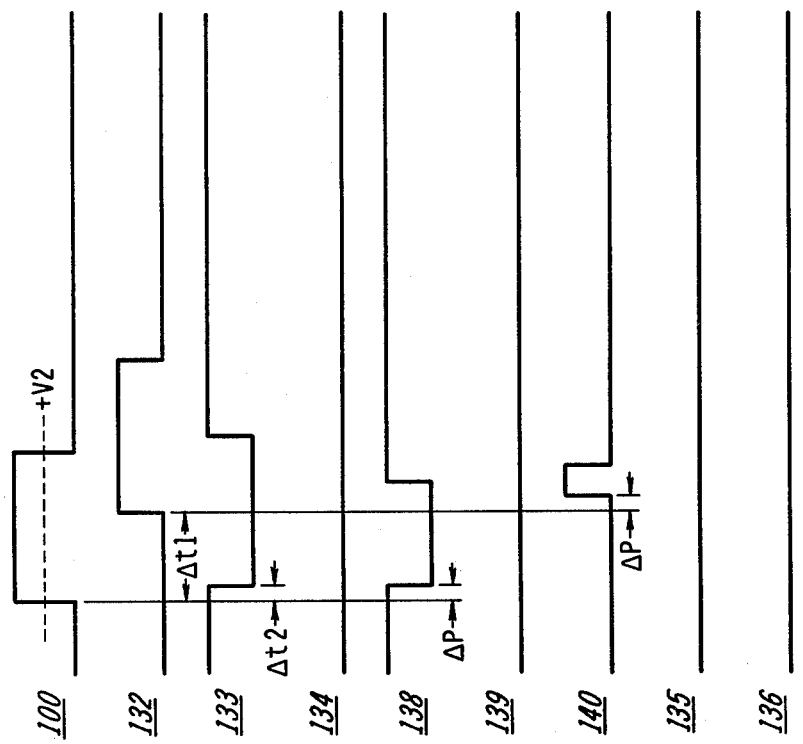
FIG. 3 is a timing diagram showing operation of the circuit of FIG. 1 upon receipt of an incoming signal pulse of amplitude greater than a threshold amplitude and width greater than a predetermined width.
Figure 2:
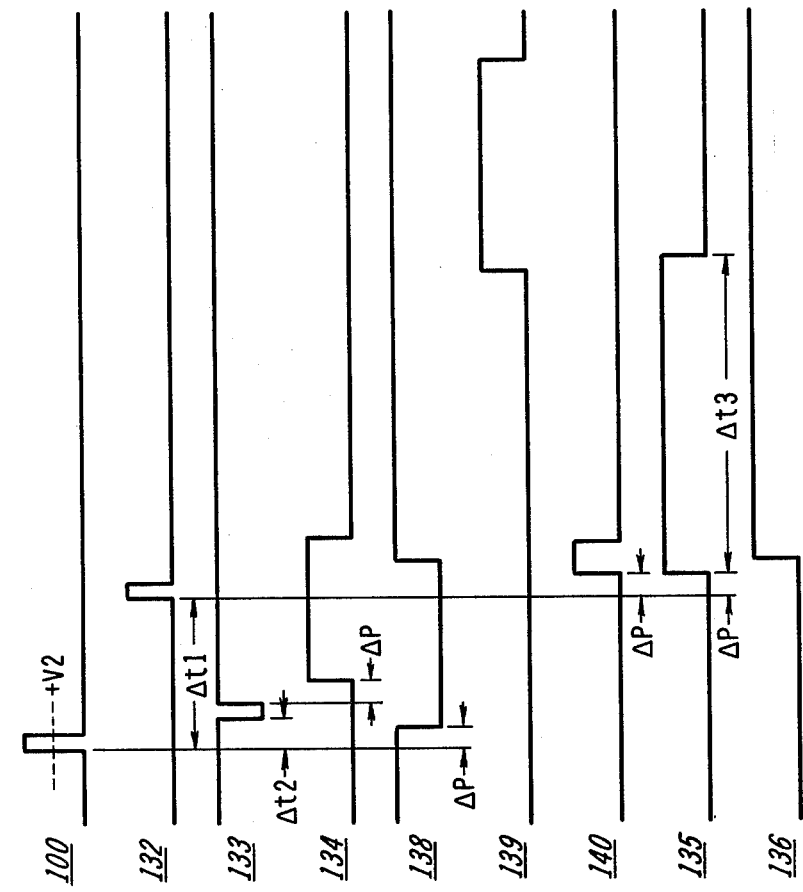
FIG. 2 is a timing diagram showing operation of the circuit of FIG. 1 upon receipt of an incoming signal pulse of amplitude greater than a threshold amplitude and a width less than a predetermined width.

FIGS. 2 and 3 are examples of timing diagrams of signal pulses in the circuit of FIG. 1 in response to noise pulses of various widths. Flip-flops 122 through 126 are assumed to have "input to output" propagation delays ($\Delta P$) of approximately three nanoseconds. Additionally, the delay circuits T1, T2, and T3 were chosen to be of delay values thirty-six ($\Delta T1$), three ($\Delta T2$), and sixty nanoseconds ($\Delta T3$), respectively. Utilizing the aforementioned values, the pulse width threshold value $\Delta T$, i.e., the maximum pulse width at which a pulse will be designated a noise pulse and generate noise recognition signals on conductors 135 and 136, will be approximately equal to $(\Delta T1 - \Delta T2 - \Delta P) = 30$ nanoseconds. This formula was previously described in the present specification.

With reference to the illustrative embodiment of the present invention shown in FIG. 1, FIG. 2 shows an incoming signal on conductor 100 with a pulse width of less than the nominal propagation delay of a flip-flop, representing a narrow noise pulse, having an amplitude greater than V2. The minimum detectable pulse width is determined by the ability of the flip-flop to recognize an input signal. For input signals of sufficient amplitude, the minimum recognizable pulse width can be less than the propagation time of the flip-flop which is in the three nanosecond range for present state of the art devices. For purposes of simplicity, the propagation delay of voltage comparator 120, which will not substantially affect the operation of the circuit, has been eliminated from the diagrams. As shown in FIG. 2, the signal on conductor 132 consists of a pulse of equal duration as the incoming signal pulse but delayed by a time duration equal to that of the T1 delay circuit. The signal on conductor 133 is the inverted output signal of voltage comparator 120 delayed by a time duration equal to that of the T2 delay circuit, and is utilized as the clock signal input to the flip-flop 122. The signal on conductor 133 is a negative transition pulse and thus, is the trailing edge of the pulse which will activate flip-flop 122. The leading edge of the signal at output terminal 130 of voltage comparator 120 operates as a clock signal to flip-flop 123. The primary utilization and benefit of the delay circuit T2 now becomes apparent. Approximately one propagation delay interval ($\Delta P$) after the occurrence of the leading edge of the pulse at input terminal 100, flip-flop 123 will be set and the signal on conductor 138 will go to a low state, thereby enabling flip-flop 122. Delay circuit T2 allows the enabling of flip-flop 122 prior to the occurrence of the trailing edge of the signal on conductor 133 at the clock input terminal of flip-flop 122. As long as the delay interval $\Delta T2$ of delay circuit T2 is of sufficient duration and substantially equal to or greater than the propagation delay $\Delta P$ of flip-flop 123, noise pulses of durations less than $\Delta P$ may be detected by the circuit.

The Q output signal of the flip-flop 122 on conductor 134 will go to a high state a delay period $\Delta P$ after the trailing edge of the signal pulse on conductor 133 has occurred at the clock input of flip-flop 122. The signal on conductor 134 is utilized as the "D" input signal to flip-flop 124. The signal on conductor 134 is in a high state at the time of the occurrence of the leading edge of the signal on conductor 132 at the clock signal input of flip-flop 124. Thus, flip-flop 124 will be set and its Q output signal will go to a high state approximately one delay period $\Delta P$ after the leading edge of the signal on conductor 132. It is this relationship, i.e., the signal on conductor 134 being high at the time of the leading edge of the signal on conductor 132, which is utilized to designate the incoming signal on conductor 100 to be a noise pulse. The Q output signal on conductor 135 is thus a noise recognition signal. The signal on conductor 135 is connected through the T3 delay circuit to the RESET input terminal of flip-flop 124. The signal on conductor 139 is the result of the signal on conductor 135 delayed by $\Delta T3$. Approximately one delay period $\Delta P$ after the occurrence of the leading edge of the signal on conductor 139, flip-flop 124 will be reset and the signal on conductor 135 will go to a low state. The low state of the signal on conductor 135 will then cause flip-flop 124 to be re-enabled after delay $\Delta T3$. Thus, the signal on conductor 135 is a noise pulse recognition signal with a pulse width substantially equal to $\Delta T3$. The leading edge of the noise pulse recognition signal on conductor 135 is utilized as the clock signal input to flip-flop 126. The Q output signal on conductor 136 will go to a high state approximately one delay period $\Delta P$ after the occurrence of the leading edge of the noise pulse recognition signal on conductor 135. The signal on conductor 136 is a noise recognition signal which will remain in a high state until initialization switch S3 is momentarily switched to a high state voltage V4, resetting flip-flop 126.

The signal on conductor 132, the output signal from the T1 delay circuit, is also utilized as the clock signal input to flip-flop 125. The Q output signal of flip-flop 125 occurring on conductor 140 will go to a high state in a time equal to approximately one delay period $\Delta P$ after the leading edge of the signal on conductor 132. The high state signal on conductor 140 will reset flip-flop 123, and the $\bar{Q}$ output signal of flip-flop 123 on conductor 138 will then reset flip-flop 122, driving the Q output signal on conductor 134 to a low state.

FIG. 3 shows an example of an incoming signal pulse with a duration of approximately forty-eight nanoseconds, i.e., with a width greater than the noise pulse threshold width $\Delta T$ of approximately thirty nanoseconds. The incoming signal pulse on conductor 100 is also shown to have an amplitude greater than the pulse amplitude threshold value of V2. As in the example of FIG. 2, the signal on conductor 132 consists of a pulse of a duration equal to the duration of the incoming signal pulse on conductor 100, but delayed by a time $\Delta T1$. The signal on conductor 133 is the inverted output signal at terminal 131 of the voltage comparator 120 delayed by time $\Delta T2$, and is utilized as the clock signal input to flip-flop 122. The leading edge of the direct output signal at terminal 130 of voltage comparator 120 operates as a clock signal to flip-flop 123. The $\bar{Q}$ output signal on conductor 138 will go to a low state in a time substantially equal to that of one delay period $\Delta P$ after the leading edge of the signal on terminal 130, and will thus enable flip-flop 122. As described in the example of FIG. 2, the leading edge of the delayed signal on conductor 132 is utilized as a clock signal to flip-flop 125. The Q output signal of flip-flop 125 on conductor 140 will go to a high state and is utilized to reset flip-flop 123. The $\bar{Q}$ output signal on conductor 138 will thus go to a high state and will reset flip-flop 122. Differing from the example of FIG. 2, flip-flop 122 will be reset prior to the occurrence of the trailing edge of the signal on conductor 133 at the clock input of flip-flop 122. Thus, the trailing edge of the signal on conductor 133 will not set flip-flop 122 and the Q output signal on conductor 134 will remain in a low state. When the leading edge of the signal on conductor 132 triggers the clock input of flip-flop 124, the signal at the D input terminal, i.e., the signal on conductor 134, will be in a low state and the result will be a continuing low signal on conductor 135 at the Q output terminal of flip-flop 124. With a continuing low signal on conductor 135, flip-flop 126 will remain in a reset state and the signal on conductor 136 will remain in a low state. Thus, with the noise recognition signal on conductors 135 and 136 remaining in a low state, the incoming signal pulse on conductor 100 is designated as a valid pulse, i.e., a pulse with a duration greater than the noise pulse threshold width of thirty nanoseconds.

It will be apparent to those skilled in the art that modifications and variations of the above-described illustrative embodiment of the invention may be effected without departing from the spirit and scope of the novel concepts of the present invention.

What is claimed is:

1. A noise pulse detection circuit, having an input terminal, for generating an output recognition signal indicative of an incoming signal pulse applied to said input terminal having a pulse duration less than a prescribed duration, comprising:

circuit means having a first circuit terminal and a second circuit terminal;

delay means connected to said input terminal and to said first circuit terminal and responsive to a direct input signal applied to said input terminal for generating a delayed signal delayed by a predetermined period of time from said direct input signal and having a discernible leading edge and trailing edge;

characterized in that said noise pulse detection circuit further comprises:

signal inverter means connected to said input terminal and said second circuit terminal for generating an inverted input signal having a discernible leading edge and trailing edge, which is the logical inverse of said direct input signal applied to said input terminal; and said circuit means is responsive to said delayed signal and said inverted input signal for generating an output recognition signal when said trailing edge of said inverted input signal is applied to said circuit means prior to said leading edge of said delayed signal.

2. A noise pulse detection circuit in accordance with claim 1 characterized in that said circuit means comprises a bistable means having a set terminal and a reset terminal, and a further delay means connected to said reset terminal and responsive to said output recognition signal for generating a reset signal at said reset terminal delayed by a predetermined period of time from said output recognition signal and further responsive to a termination of said output recognition signal for terminating said reset signal after said predetermined period of time thereby enabling said bistable means;

said bistable means being connected to said first and said second circuit terminals, and responsive to said delayed signal and said inverted input signal for generating said output recognition signal when said trailing edge of said inverted input signal is applied to said second circuit terminal prior to the application of said leading edge of said delayed signal to said first circuit terminal; and said bistable means being further responsive to said reset signal for terminating said output recognition signal.

3. A noise pulse detection circuit, having an input terminal, for generating an output recognition signal indicative of an incoming signal pulse applied to said input terminal having a pulse duration less than a prescribed duration, comprising:

circuit means having a first circuit terminal and a second circuit terminal;

first delay means connected to said input terminal and to said first circuit terminal and responsive to a direct input signal applied to said input terminal for generating a first delayed signal having a discernible leading edge and trailing edge and delayed in time from said direct input signal by a first predetermined period of time;

characterized in that said noise pulse detection circuit further comprises:

signal inverter means connected to said input terminal for generating an inverted input signal having a discernible leading and trailing edge, which is the logical inverse of said direct input signal applied to said input terminal;

second delay means connected to said signal inverter means and responsive to said inverted input signal for generating a second delayed signal having a discernible leading edge and trailing edge and delayed in time from said inverted input signal by a second predetermined period of time;

first bistable means having a set state and a reset state and connected to said second delay means and said second circuit terminal of said circuit means and responsive to said second delayed signal to change from said reset state to said set state;

reset means connected to said first delay means, said input terminal, and said first bistable means and responsive to said leading edge of said first delayed signal for applying a first reset signal to said first bistable means to place said first bistable means in said reset state, and further responsive to said leading edge of said direct input signal for terminating said first reset signal thereby enabling said first bistable means prior to the occurrence of said trailing edge of said second delayed signal; and said circuit means is responsive to said first delayed signal and to the state of said first bistable means for generating an output recognition signal when said leading edge of said first delayed signal is applied to said circuit means while said first bistable means is in said set state.

4. A noise pulse detection circuit in accordance with claim 3 characterized in that said reset means comprises a second bistable means and a third bistable means each having a set state and a reset state;

said second bistable means being connected to said first delay means and to said third bistable means and responsive to said leading edge of said first delayed signal for applying a second reset signal to said third bistable means; and said third bistable means being connected to said input terminal, to said first bistable means, and to said second bistable means and responsive to said second reset signal for generating said first reset signal and for applying said first reset signal to said first bistable means and to said second bistable means and further responsive to a leading edge of said direct input signal applied to said input terminal for terminating said first reset signal thereby enabling said first bistable means and said second bistable means.

5. A noise pulse detection circuit having an input terminal and a first and a second output terminal for generating noise pulse recognition signals indicative of an input signal applied to said input terminal having discernible leading and trailing edges and a pulse amplitude greater than a prescribed amplitude and a pulse duration less than a prescribed duration, comprising:

voltage comparison means connected to said input terminal for generating a direct amplitude recognition signal and an inverted amplitude recognition signal;

characterized in that said noise pulse detection circuit further comprises:

pulse width discrimination means connected to said voltage comparison means and responsive to said direct amplitude recognition signal and said inverted amplitude recognition signal for generating a pulse width recognition signal; and signal generating means connected to said pulse width recognition means and to said first and said second output terminals and responsive to said pulse width recognition signal for generating a noise output recognition pulse at said first output terminal and a continuous noise output recognition signal at said second output terminal.

6. A noise pulse detection circuit in accordance with claim 5 characterized in that said voltage comparison means further comprises:

reference sources for generating first and second voltage reference signals;

first comparison means connected to said input terminal for comparing said first voltage reference signal and said input signal and for generating a direct amplitude recognition signal and an inverted amplitude recognition signal when a positive transition pulse of said input signal is greater in amplitude than said first voltage reference signal;

second comparison means connected to said input terminal for comparing said second voltage reference signal and said input signal and generating a direct amplitude recognition signal and an inverted amplitude recognition signal when a negative transition pulse of said input signal is greater in amplitude than said second voltage reference signal and;

switching means individually connectable to said first comparison means for applying said direct amplitude recognition signal and said inverted amplitude recognition signal generated by said first comparison means to said pulse width discrimination means and individually connectable to said second comparison means for applying said direct amplitude recognition signal and said inverted amplitude recognition signal generated by said second comparison means to said pulse width discrimination means.

7. A noise pulse detection circuit in accordance with claim 5 characterized in that said signal generating means further comprises:

an input terminal connected to said first output terminal for receiving said pulse width recognition signal from said pulse width discrimination means and applying said pulse width recognition signal to said first output terminal;

delay means connected to said pulse width discrimination means and to said input terminal of said signal generating means and responsive to said pulse width recognition signal appearing at said input terminal of said signal generating means for terminating said pulse width recognition signal thereby generating a noise output recognition pulse with a predetermined pulse duration at said first output terminal;

bistable means connected to said first output terminal and to said second output terminal and responsive to a leading edge of said noise output recognition pulse appearing at said first output terminal for generating a continuous noise output recognition signal at said second output terminal; and switching means connected to said bistable means and connectable to a voltage signal source, said bistable means being responsive to said switching means being connected to said voltage signal source for terminating said continuous noise output recognition signal.

8. A noise pulse detection circuit having an input terminal, for generating an output recognition signal indicative of an incoming signal pulse applied to said input terminal having a pulse duration less than a prescribed duration, comprising:

circuit means;

first delay means connected to said input terminal and to said circuit means and responsive to an input signal applied to said input terminal for generating a first delayed signal having a discernible leading edge and trailing edge and delayed in time from said input signal by a first predetermined period of time;

characterized in that said noise pulse detection circuit further comprises:

means connected to said input terminal for generating a delayed inverted signal having a discernible leading and trailing edge which is the logical inverse of said input signal delayed in time from said input signal by a second predetermined period of time;

first bistable means having a set state and a reset state and connected to said circuit means and said means for generating said delayed inverted signal and responsive to said delayed inverted signal to change from said reset state to said set state;

second bistable means having a set state and a reset state and connected to said input terminal and said first bistable means to hold said first bistable means in its reset state when said second bistable means is in the reset state;

means for initializing said second bistable means to the reset state prior to the occurrence of an input signal on said input terminal;

said second bistable means being responsive to said input signal to change from the reset state to the set state thereby enabling said first bistable means;

said means for generating said delayed inverted signal being adapted to delay said logical inverse of said input signal by a period of time approximately equal to but not less than the propagation delay through said second bistable means; and said circuit means being responsive to said first delayed signal and the state of said first bistable means to generate an output signal when said first delayed signal is applied to said circuit means while said first bistable means is in the set state.

9. A method of generating an output recognition signal at an output terminal connected to a circuit means comprising a first circuit terminal and a second circuit terminal and indicative of an input signal pulse applied to an input terminal having a pulse duration less than a prescribed duration, comprising the steps of:

A. delaying an input signal pulse and generating a delayed input signal having discernible leading and trailing edges delayed from said input signal by a period of time equal to said prescribed duration;

B. applying said delayed signal to said first circuit terminal;

C. inverting said input signal pulse and generating an inverted signal having discernible leading and trailing edges which is the logical inverse of said input signal pulse and applying said inverted signal to said second circuit terminal; and D. generating said output recognition signal at said output terminal when said trailing edge of said inverted input signal is applied to said circuit means prior to said leading edge of said delayed signal.

10. A method of generating an output recognition signal indicative of an incoming signal pulse having a pulse duration less than a prescribed duration, comprising the steps of:

A. delaying an incoming signal pulse by a first predetermined period of time and generating a first delayed input signal having a discernible leading and trailing edge;

B. inverting said incoming signal pulse and generating an inverted input signal which is the logical inverse of said incoming signal pulse;

C. delaying said inverted input signal by a second predetermined period of time and generating a second delayed input signal having a discernible leading and trailing edge;

D. generating a first output signal upon occurrence of said trailing edge of said second delayed input signal;

E. generating said output recognition signal at said output terminal when said leading edge of said first delayed signal occurs after the generation of said first output signal.

* * * * *